United States Patent [19]

Crop

[11] 4,070,615
[45] Jan. 24, 1978

[54] COMPENSATION INDICATOR FOR ATTENUATION PROBE

[75] Inventor: Roland Emil Crop, Portland, Oreg.

[73] Assignee: Tektronix, Inc., Beaverton, Oreg.

[21] Appl. No.: 685,462

[22] Filed: May 12, 1976

[51] Int. Cl.² .............................................. G01R 27/00
[52] U.S. Cl. ................................. 324/57 R; 328/148; 328/149; 328/163
[58] Field of Search ................ 324/57 R, 65 P, 65 R; 307/235 J; 328/163, 147, 148, 149; 330/30 D

[56] References Cited

U.S. PATENT DOCUMENTS

| | | | |
|---|---|---|---|
| 2,143,094 | 1/1939 | Swift | 324/57 R |
| 2,680,834 | 6/1954 | Burns et al. | 324/65 P |
| 2,805,392 | 9/1957 | Schnoll | 324/57 R X |
| 2,870,430 | 1/1959 | Hancock | 324/57 R X |
| 3,419,799 | 12/1968 | Papadeas | 324/57 R |
| 3,617,879 | 11/1971 | Mugnier | 324/57 R |
| 3,866,130 | 2/1975 | Krause | 328/149 X |
| 3,979,667 | 9/1976 | Cornes | 324/65 R |

*Primary Examiner*—Stanley T. Krawczewicz
*Attorney, Agent, or Firm*—George T. Noe

[57] ABSTRACT

A circuit is provided for generating signals proportional to distortion of a square-wave reference signal caused by the impedance mismatch of an attenuator probe and the input impedance of an electronic instrument. The generated signals are utilized to control an indicator device and thereby provide an indication of the mismatch as well as proper compensation of the probe.

7 Claims, 5 Drawing Figures

४,०७०,६१५

COMPENSATION INDICATOR FOR ATTENUATION PROBE

BACKGROUND OF THE INVENTION

This invention relates to indicating devices in general, and in particular to devices for indicating the proper adjustment of a frequency-compensated attenuation probe to provide an impedance match to the input circuitry of an electronic instrument to which a probe is coupled.

Attenuation probes have long been used in connection with oscilloscopes to permit a signal under test to be divided down to an amplitude usable by the input circuit of such oscilloscope. Because oscilloscopes are general purpose instruments, they have wide-band capabilities to permit the instrument to respond to a broad range of frequencies. The input circuits thereof have necessarily been frequency compensated to minimize distortion of an input signal. The attenuation probe includes passive components to provide a precise impedance match between the probe and the input circuit, and such probes typically include one or more variable capacitors to permit an operator to properly compensate the probe.

A typical method of compensating the probe for use with an oscilloscope is to apply a precise square-wave reference signal to the probe while viewing the resultant signal on the oscilloscope screen. Distortions in the square wave produced by the impedance mismatch are indicated on the wave form by either a peaked or rolled-off leading edge of the square wave. The probe may be adjusted while watching the display to adjust the square wave to a square leading corner.

Other electronic instruments having wide-band capability, such as counters and the like, have come into wide usage, and such instruments lend themselves to usage of an attenuation probe therewith to reduce the amplitude of an input signal to a usable level. However, these instruments do not have a display device for viewing an input waveform and it is difficult to properly compensate the probe without the use of an oscilloscope.

SUMMARY OF THE INVENTION

In accordance with the present invention, a square wave signal is applied directly to a first input of a differential amplifier, and simultaneously applied via an attenuation probe and input circuitry of an electronic instrument to a second input of the differential amplifier. The common mode signal between the first and second inputs of the differential amplifier is rejected, while distortions due to roll off or peaking of the square wave through the attenuation probe results in positive going and negative going pulses at the output of the differential amplifier. A half-wave rectifier circuit is connected to the output of the differential amplifier to clip off the negative going portions of the generated signal and to develop a control voltage proportional to the amount of distortion to be applied to a light-emitting diode. The light-emitting diode produces the highest light intensity when the probe is properly compensated, and correspondingly dims as distortions increase, so that a visual indication of proper probe compensation is provided.

It is therefore one object of the present invention to provide indication of proper compensation for an attenuation probe.

It is another object of the present invention to provide a circuit for detecting the amount of distortion caused by the impedance mismatch between an attenuation probe and the input circuit of an electronic instrument.

It is a further object of the present invention to provide a circuit for generating a control voltage proportional to the distortion of a reference signal to be applied to an illumination circuit wherein the illumination is brightest when the distortion is least.

It is an additional object of the present invention to provide a method for compensating an attenuation probe without the use of an oscilloscope.

Further objects, features, and advantages will apparent from consideration of the following description taken in conjunction with the accompanying drawings.

DRAWINGS

FIG. 1 shows a simplified block diagram of a system for indicating the compensation of an attenuation probe;

FIG. 2-A shows a waveform ladder diagram of waveforms present in the system of FIG. 1 when a probe is overcompensated;

FIG. 2-B shows a waveform ladder diagram of waveforms present in the system of FIG. 1 when a probe is undercompensated;

FIG. 2-C shows a waveform ladder diagram of waveforms present in the system of FIG. 1 when a probe is properly compensated; and FIG. 3 shows a detailed schematic of the preferred embodiment of the present invention.

DETAILED DESCRIPTION OF THE INVENTION

Figure 1:
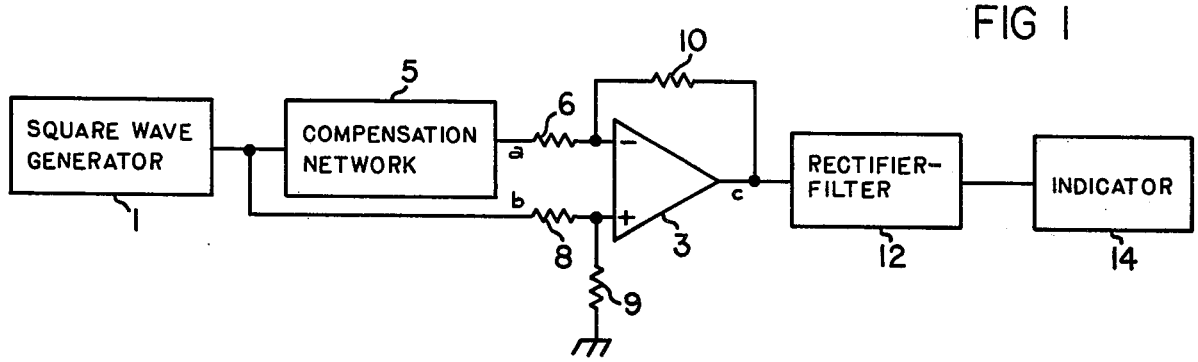

A reference signal having a predetermined amplitude and frequency, for example, 3 volts peak to peak at 1 kHz, is generated by a square wave generator 1. The reference signal is applied simultaneously to the inverting and non-inverting inputs of an operational amplifier 3 via a compensation network 5 and resistor 6 connected to the inverting, or −input, and via an attenuator comprising resistors 8 and 9 to the non-inverting, or +input. The compensation network 5 may suitably include a frequency-compensated probe and the frequency-compensated input circuitry of an electronic instrument. These circuits include resistors and capacitors for impedance matching, and it is generally necessary to match the impedance of the probe to the impedance of the input circuitry. Operational amplifier 3 includes a feedback resistor 10 and operates as a differential amplifier. The output of operational amplifier 3 is applied to a rectifier-filter network 12, the output of which is connected to an indicator device 14.

Figure 2A:
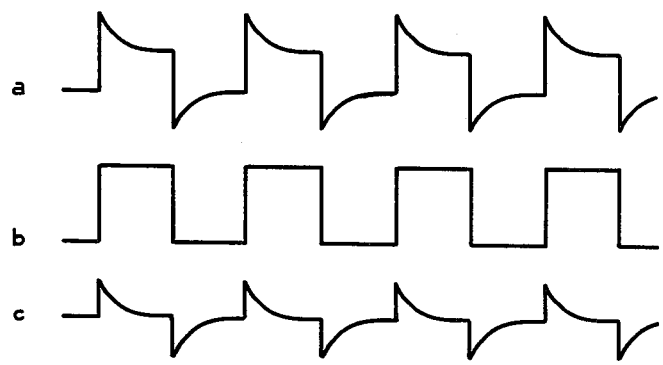
Figure 2B:
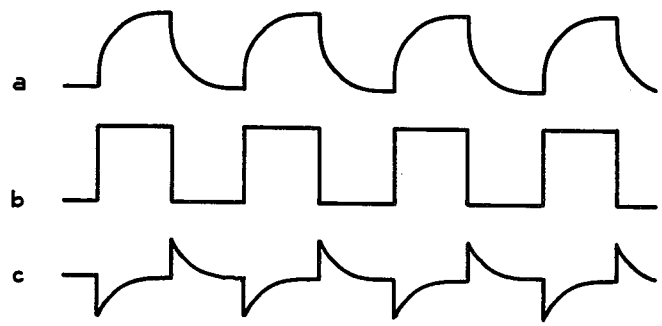
Figure 2C:
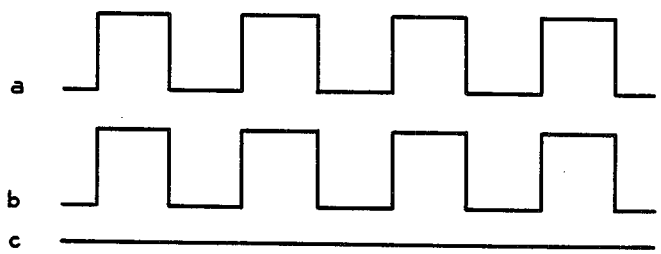

The operation of the system set forth in FIG. 1 will best be understood from the waveforms shown in FIGS. 2A-C. In FIG. 2A, wave form $a$ shows the overcompensated square wave from an improperly compensated probe, such wave form being applied to the −input of operational amplifier 3. Wave $b$ of FIG. 2A shows the square wave reference signal from square wave generator 1 as it is applied to the +input of operational amplifier 3. Waveform $c$ shows the difference between waveforms $a$ and $b$, and is available at the output of operational amplifier 3. It is understood that the amplitude of waveform $c$ may be amplified to any desired magnitude, depending on the sizes of resistors 6 and 10, which set the gain for amplifier 3. Rectifier 12 passes only the positive-going peaks of waveform $c$, developing a positive voltage across an associated filter network. The positive voltage is in turn applied to indicator 14. Indicator 14 may be a lamp circuit having one end thereof connected to a suitable source of positive voltage so that a positive control voltage applied thereto from rectifier-filter 12 tends to dim the lamp, or a meter or tone generator may be utilized to provide an indication.

FIG. 2B shows a set of waveforms for the under-compensated case of the probe. Here, waveform $a$ is shown having rolled-off leading and trailing edges of the square wave pulse, rather than the positive- and negative-going peaks of the over-compensated case. Waveform $b$ is the square wave reference signal as discusses hereinabove. Waveform $c$ again is the difference between waveforms $a$ and $b$, and it can be seen that the waveform $c$ is similar to that described for the over-compensated case. Thus, the rectifier-filter 12 again passes only the positive-going peaks, developing a control voltage to be applied to indicator 4 as described for the over-compensated case.

FIG. 2C shows the waveforms for a properly compensated probe. The waveform $a$ is an undistorted square wave, and is identical to waveform $b$. Thus, the signal is applied in common mode to the inputs of operational amplifier 3 resulting in a no-signal output from amplifier 3. In turn, the output of rectifier-filter 12 drops to zero, causing a maximum indication by indicator 14.

Figure 3:
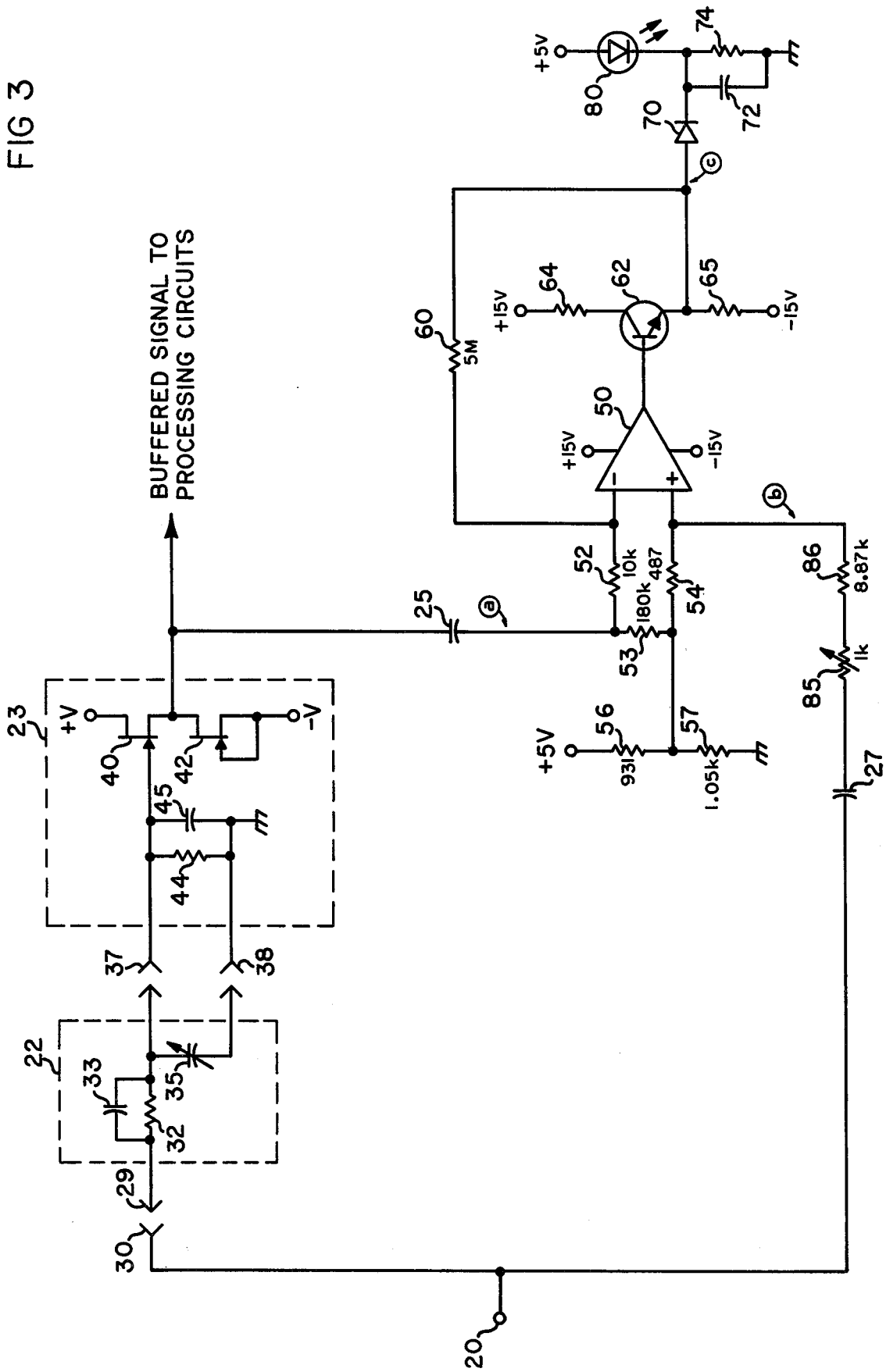

FIG. 3 shows a preferred embodiment of the present invention, and may be described in connection with the waveforms of FIGS. 2A-C. A reference square wave signal is applied to an input terminal 20. The reference signal may be a 3-volt peak-to-peak square wave as discussed above. The reference signal is applied via a probe 22 and input buffer amplifier 23 to a first coupling capacitor 25, and is simultaneously applied to a second coupling capacitor 27. The probe 22 includes a probe tip connected to a jack 30 and at least one internal resistor 32 shunted by a capacitor 33, and an adjustable capacitor 35. The probe 22 is connected to the input of an electronic instrument via input connectors 37 and 38. Input connector 37 passes the signal, while input terminal 38 provides a ground connection for the probe. The input buffer amplifier 23 may suitably include a first field-effect transistor 40 and a second field-effect transistor 42 serially connected between suitable sources of positive and negative voltage. Field-effect transistor 40 provides a high input impedance to the signal, and behaves as a source follower. Field-effect transistor 42 provides a current source for operation of field-effect transistor 40. The input impedance of input buffer amplifier 23 is established by the parallel combination of resistor 44 and capacitor 45. Resistor 44 may suitably be a 1 megohm resistor, and the value of capacitor 45 may be chosen to provide a predetermined frequency response. Probe 22 may suitably be an attenuation probe having any predetermined attenuation ratio, for example, 1:1, 10:1, 100:1, etc. The value of resistor 32 is chosen to provide the proper voltage divider ratio. Capacitors 33 and 35 may be chosen to provide the appropriate capacity divider ratio to provide proper frequency compensation for the probe. That is, the impedance of probe 22 should be matched to the impedance of input buffer amplifier 23 to provide best frequency response so that an input signal is not distorted because of impedance mismatch. Capacitor 35 is typically adjustable to permit such probe to be operated with a number of electronic instruments. An operator connects the probe and adjusts the capacitor 35 for best compensation. Such probe 23 and input buffer amplifier 23 have been utilized for many years and are well known to those skilled in the art. In addition to being applied to coupling capacitor 25, the buffered input signal may be passed to the processing circuitry of the electronic instrument to be utilized in accordance with the type of instrument involved. The waveform $a$ at coupling capacitor 25 is dependent upon the adjustment of capacitor 35, and may be peaked as a result of over compensation, rolled off as a result of under compensation, or have square corners as a result of proper compensation. These three situations were discussed previously in connection with waveforms $a$ of FIGS. 2A-C.

Operational amplifier 50 provides a comparison between waveforms $a$ and $b$ and generates an output signal proportional to the difference therebetween. In the quiescent, or no-signal condition, the resistive network comprising resistors 52, 53, and 54 connected to voltage divider resistors 56 and 57 establishes the biasing conditions for operational amplifier 50. Assuming that the inverting and non-inverting inputs, typically designated − and + inputs respectively, are connected to the bases of internal transistors, these resistors together with feedback resistor 60 provide base current paths. The output of operational amplifier 50 is connected to the base of a transistor 62, whose collector is connected through a resistor 64 to a suitable source of positive voltage and whose emitter is connected through a resistor 65 to a suitable source of negative voltage. Transistor 62 is operated as an emitter follower, and the emitter thereof is connected through resistor 60 to the non-inverting input of amplifier 50 to complete the feedback loop. Thus, through operational amplifier action, the inverting and non-inverting inputs tend to balance themselves at the same voltage while providing a stable output level. It can be seen from the values of resistors 52, 53, and 54 that all of the base current from the non-inverting input flows through resistor 54, while all but a small percentage of the base current from the inverting input is forced through resistor 60. This action raises the emitter of transistor 62 to a suitable quiescent positive output level.

The emitter of transistor 62 is connected to the anode of a rectifier diode 70, the anode of which is connected to ground through the parallel combination of resistor 72 and filter capacitor 74. A light-emitting diode 80 has its anode connected to a suitable source of positive voltage, and its cathode connected to the cathode of diode 70, and is utilized as an indicating device as described below.

The quiescent voltage at the emitter of transistor 62, and hence at the anode of diode 70, is set to provide a full forward-bias voltage across light-emitting diode 80, so that a maximum light intensity is produced therefrom when no signal is present.

The waveform $a$ is applied via coupling capacitor 25 and resistor 52 to the inverting input of amplifier 50, and the waveform $b$ is applied via coupling capacitor 27 and resistors 85 and 86 to the non-inverting input. Resistor 85 is adjustable to match the common-mode amplitudes of waveform signals $a$ and $b$. If waveform $a$ is undistorted as shown in FIG. 2C, it will be the same as waveform $b$ and the two waveforms will be applied to the inverting and non-inverting inputs of operational amplifier 50 in common mode. The difference between these two signals is close to zero and so that the output waveform c is the quiescent DC level and therefore light-emitting diode 80 is turned on to maximum brightness.

If the input waveform a is distorted as shown in FIGS. 2A and B, the output waveform c at the emitter of transistor 62 will be a series of positive and negative-going spikes as shown in FIGS. 2A and B. Waveform c will be rectified to remove the negative-going portion thereof, and the positive-going portion thereof will be developed across resistor 72 and the filtered to an average level by capacitor 74. This rectified positive voltage is applied to the cathode of light-emitting diode 80, reducing the conduction thereof and dimming the light produced thereby.

In summary, an indicator is provided to indicate the compensation of an attenuation probe without the use of an oscilloscope. A reference signal is generated and coupled to both the inverting and non-inverting inputs of an operational amplifier. An attenuation probe and the input circuitry of an electronic instrument are disposed in the signal path between the reference signal generator and the inverting input of the operational amplifier so that any distortion produced by an impedance mismatch between the probe and input circuitry will appear at the negative input of the operational amplifier. The common mode signal is rejected, and only the distortion is amplified and passed to a rectifier circuit which removes the negative-going portions of the signal and develops a control voltage to reduce the light intensity from a light-emitting diode. An operator may connect his probe to the input circuitry and adjust the variable capacitance thereof while watching the indicator light, which will be at its maximum intensity when the probe is properly compensated.

It will be obvious to those having ordinary skill in the art that many changes and modifications may be made in the details of the above-described embodiment of the present invention. For example, different types of active devices such as transistors can be employed, and power supply voltages and component values may readily be changed to other suitable values without changing the basic operating principles of the system hereinabove described. Therefore, the scope of the present invention should be determined only by the following claims.

I claim:

1. A circuit for indicating adjustment of a frequency compensation network; comprising;
    a source of square-wave signals, said frequency compensation network being coupled to the output of said signal source;
    differential amplifier means having a first input coupled to the output of said frequency compensation network and a second input coupled to the output of said signal source; the output signal of said differential amplifier being proportional to distortion caused by said frequency compensation network;
    means for converting said output signal to a control voltage; and
    indication means responsive to said control voltage for providing an indication of said compensation network adjustment.

2. A circuit according to claim 1 wherein said differential amplifier comprises an operational amplifier wherein said first input is an inverting input and said second input is a non-inverting input, said operational amplifier including a feedback network connected between the output thereof and said first input.

3. A circuit according to claim 1 wherein said converting means comprises a rectifier and filter.

4. A circuit according to claim 1 wherein said indication means comprises illumination means whose illuminance is inversely proportional to said control voltage.

5. A circuit for indicating the adjustment of a frequency-compensated attenuator probe coupled to the input circuit of an electronic instrument, comprising:
    a square-wave generator;
    a differential amplifier for producing a difference signal;
    a first signal path from said square-wave generator through said probe and input circuit to a first input of said differential amplifier;
    a second signal path from said square-wave generator to a second input of said differential amplifier; and
    an output circuit including an indicating device connected to said differential amplifier, said output circuit developing a control voltage porportional to said difference signal to be applied to said indicating device.

6. A circuit according to claim 5 wherein said second signal path includes an attenuator to match the attenuation of said probe.

7. A circuit according to claim 5 wherein said output circuit includes a rectifier filter to produce said control voltage.

* * * * *